(12) United States Patent
Park et al.

(10) Patent No.: US 9,466,359 B2
(45) Date of Patent: Oct. 11, 2016

(54) STATIC RANDOM ACCESS MEMORY AND DRIVING METHOD THEREOF

(71) Applicant: Korea University Research and Business Foundation, Seoul (KR)

(72) Inventors: Jong Sun Park, Seoul (KR); Woong Choi, Bucheon-Si (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 14/831,035

(22) Filed: Aug. 20, 2015

(65) Prior Publication Data

US 2015/0364184 A1    Dec. 17, 2015

Related U.S. Application Data

(63) Continuation of application No. PCT/KR2015/003032, filed on Mar. 27, 2015.

(30) Foreign Application Priority Data

Mar. 27, 2014 (KR) ................. 10-2014-0036140

(51) Int. Cl.
*G11C 5/14*     (2006.01)
*G11C 11/419*   (2006.01)
*G11C 8/08*     (2006.01)
*G11C 16/30*    (2006.01)
(Continued)

(52) U.S. Cl.
CPC ............ *G11C 11/419* (2013.01); *G11C 5/145* (2013.01); *G11C 5/147* (2013.01); *G11C 7/12* (2013.01); *G11C 8/08* (2013.01); *G11C 16/30* (2013.01); *G11C 11/4074* (2013.01)

(58) Field of Classification Search
CPC ... G11C 5/147; G11C 5/145; G11C 11/4074; G11C 8/08; G11C 16/30

USPC ............................. 365/189.09, 154
See application file for complete search history.

(56) References Cited

U.S. PATENT DOCUMENTS 6,140,847 A * 10/2000 Le Campion ............ H03K 3/57
                                                 108/103
6,657,905 B1 * 12/2003 Koelling ................ G11C 17/18
                                                  365/149

(Continued)

FOREIGN PATENT DOCUMENTS

KR    2010-0101008 A    9/2010

OTHER PUBLICATIONS

International Search Report of PCT/KR2015/003032 dated Jun. 26, 2015.

*Primary Examiner* — Pho M Luu
(74) *Attorney, Agent, or Firm* — Fox Rothschild LLP; Peter J. Butch, III; Carol E. Thorstad-Forsyth

(57) ABSTRACT

A static random access memory comprises a pre-charge unit that supplies a pre-charge voltage to first and second bit lines connected to a bit cell; a capacitor, of which one or the other terminal is selectively connected to a ground terminal; a clamping unit that selectively connects the bit lines with the capacitor to adjust a voltage level of the bit lines; and a mux unit that is included in a unit memory cell including the bit cell, the pre-charge unit, the capacitor and the clamping unit, and activates the bit lines of the unit memory cell in response to reception of a selection signal; wherein the clamping unit connects the first and second bit lines with the capacitor in response to a charge sharing control signal, to induce charge sharing between the first and second bit lines and the capacitor.

6 Claims, 10 Drawing Sheets

(51) Int. Cl.
*G11C 7/12* (2006.01)
*G11C 11/4074* (2006.01)

(56) References Cited

U.S. PATENT DOCUMENTS

| | | | |
|---|---|---|---|
| 7,016,230 B2 * | 3/2006 | Hosono | G11C 16/344 365/185.17 |
| 7,542,352 B1 * | 6/2009 | Kuo | G11C 16/24 365/185.18 |
| 7,692,987 B2 * | 4/2010 | Edahiro | G11C 16/32 365/185.25 |
| 8,305,820 B2 | 11/2012 | Yang et al. | |
| 2012/0140551 A1 | 6/2012 | Arsovski et al. | |
| 2012/0206988 A1 | 8/2012 | Song et al. | |
| 2013/0176796 A1 | 7/2013 | Tanabe | |

\* cited by examiner

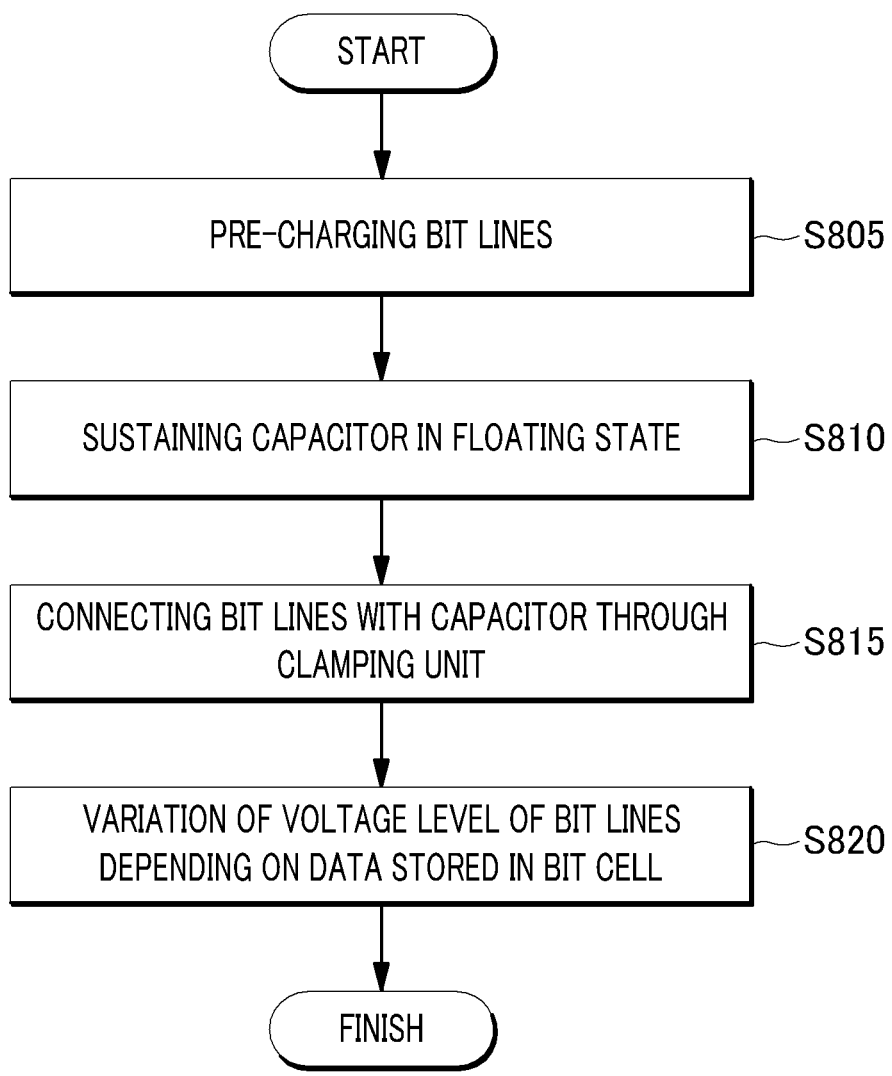

STATIC RANDOM ACCESS MEMORY AND DRIVING METHOD THEREOF

CROSS-REFERENCE TO RELATED APPLICATION

This application is a continuation of International Application No. PCT/KR2015/003032 filed on Mar. 27, 2015, which claims the benefit of Korean Patent Application No. 10-2014-0036140 filed on Mar. 27, 2014, the entire disclosures of which are incorporated herein by reference.

TECHNICAL FIELD

The embodiments described herein pertain generally to a static random access memory, which includes an assist circuit to improve an operation margin, and a driving method thereof.

BACKGROUND ART

A static random access memory (SRAM) is advantageous in that it does not need to be dynamically updated as done in a dynamic random access memory (DRAM) and is fast in speed. Such a SRAM is a block, which occupies most of an area and a consumed power of a general integrated circuit, like a communication module, an image processor and others. Accordingly, a bit cell of the SRAM is designed to be minimized so as to increase a degree of the integration, and a semiconductor process in this regard has been also miniaturized. As a result, stability of a semiconductor circuit has been deteriorated more and more, and the deterioration has been considered a serious problem in the latest process for transistors such as a fin field effect transistor (finFET).

Meanwhile, a structure of a general SRAM cell includes two (2) invertors, which are commonly formed in four (4) complementary metal-oxide semiconductor field-effect transistors (MOSFETs) and cross-coupled to one another. The cross-coupled invertors form a basic storage element with two (2) stable states. In this case, the two (2) stable states refer to '0' and '1,' which are complementary binary values. The SRAM cell includes two (2) additional transistors, which are named access transistors. In this case, the access transistors perform controlling access to the storage element during reading and writing operations.

FIG. 1 is an example for a 6T SRAM cell in accordance with a conventional technology.

The 6T SRAM cell includes six (6) transistors. As shown in FIG. 1, the 6T SRAM cell may be divided into three (3) sections, i.e., a pull-up PMOS 20, a pass-gate NMOS 10 and a pull-down NMOS 30, and nodes between the pass-gate NMOSs 10 connected to the pull-up PMOSs 20 and the pull-down NMOSs 30 hold complementary binary values.

In the writing operation of the SRAM cell, a positive voltage is applied to a word line (WL) to activate the word line, so that the pass-gate NMOSs 10 transfer values on the complementary bit lines into the SRAM bit cell. In addition, in the reading operation of the SRAM cell, the word line is activated in the state that each of the bit lines is pre-charged and held to have a pre-defined value (that is, in the pre-charge state), so that one of the bit lines is discharged by the complementary values stored within the SRAM bit cell.

Meanwhile, in order to improve an operation margin of the reading operation in the SRAM, it is necessary to make the pull-down NMOS 30 stronger than the pass-gate PMOS 10. However, since the strength of the pass-gate NMOS 10 contradicts with the operation margin of the reading and writing operations, there is a limit in improving the stability of the SRAM by adjusting the size of the bit cell. To solve this problem, the latest processes are necessarily using an assist circuit technology, which adds a separate circuit to a peripheral circuit of a memory.

The assist circuit technology may be classified into a method of controlling a voltage to be applied to a power supply of a memory bit cell, a method of controlling a voltage to be applied to a word line, or a method of controlling a voltage to be applied to a bit line. In this case, the margin of the reading operation can be improved by using a method of increasing a voltage to be applied to be a bit cell or by reducing the strength of the pass-gate NMOS 10 or increasing the strength of the pull-down NMOS 30, or through a method of lowering a voltage to be applied to a word line or a bit line. To the contrary, the margin of the writing operation can be improved by using a method of reducing a voltage to be applied to a bit cell by increasing the strength of the pass-gate NMOS 10 or reducing the strength of the pull-up PMOS 20, or through a method of increasing a voltage to be applied to a word line or a bit line.

FIG. 2 and FIG. 3 illustrate an assist circuit of a SRAM cell in accordance with a conventional technology.

In case of the form, in which the SRAM cells are dense in a cache, like a microprocessor, a power grid may be easily formed in the inside of the chip through an external power supply. However, where the SRAM is distributed in the whole chip like a system on chip (SoC), there is a problem since it is difficult to use one or more power supply sources. Accordingly, the conventionally suggested SRAM assist circuit technique generates necessary voltages such as a over-driven voltage or a under-driven voltage, in addition to a memory supply voltage, from only one power supply source through a voltage divider or a voltage regulator illustrated in FIG. 2, in addition to an additional power supply source applied from the outside. However, as a short circuit current occurs in the voltage divider or the voltage regulator, a consumed power of the voltage divider or the voltage regulator occupies most of the power consumed in the whole memory.

In addition, FIG. 3 illustrates a multiport resistor file including a multi-bit line 60 and a multi-word line 70, which are used for a high-speed parallel processor. The multiport resistor file improves the margin of the reading operation and reduces the margin of the writing operation upon use of an over-driven voltage. To the contrary, the multiport resistor file reduces the margin of the reading operation and improves the margin of the writing operation upon use of a under-driven voltage. However, the multiport resistor file that operates as described above has many restrictions in applying the conventional SRAM assist circuit techniques. For example, where the reading and writing operations are connected to an identical array, it causes deterioration of stability and performance of two (2) bit cells.

In this regard, Korean Patent Application Publication No. 2010-0101008 (Title of Invention: Semiconductor Memory Device) describes a semiconductor memory device including a SRAM, which realizes a small SRAM cell in a CMOS-type 6T-SRAM using SGT, and simultaneously, has a sufficient operation margin.

However, since this technology does not use the assist circuit technique like the conventional technology described in FIG. 1 above, there is a limit in improving the stability of the SRAM by adjusting a size of a bit cell.

DISCLOSURE OF THE INVENTION

Problems to be Solved by the Invention

The present disclosure concerns a static random access memory, which is capable of improving an operation margin of reading and writing operations and reducing a power consumed in an assist circuit through the assist circuit technique of a SRAM.

However, the problems sought to be solved by the present disclosure are not limited to the above description, and other problems can be clearly understood by those skilled in the art from the following description.

Means for Solving the Problems

A static random access memory is provided herein. The static random access memory may include: a pre-charge unit that supplies a pre-charge voltage to first and second bit lines connected to a bit cell; a capacitor, of which one or the other terminal is selectively connected to a ground terminal; a clamping unit that selectively connects the bit lines with the capacitor to adjust a voltage level of the bit lines; and a mux unit that is included in a unit memory cell including the bit cell, the pre-charge unit, the capacitor and the clamping unit, and activates the bit lines of the unit memory cell in response to reception of a selection signal. The clamping unit may connect the first and second bit lines with the capacitor in response to a charge sharing control signal, to induce charge sharing between the first and second bit lines and the capacitor, for providing charge-recycling effect.

The static random access memory may further include a writing driving unit that applies complementary-level input data to the first and second bit lines in response to a writing driving signal.

By the static random access memory, the one terminal of the capacitor may be sustained in a floating state in response to a reading command, the clamping unit may connect the first and second bit lines with the capacitor to each other for certain time to reduce the voltage level of the pre-charged bit lines by a certain voltage level, and data of the bit cell may be read based on variation of the voltage level of the first and second bit lines depending on the data stored in the bit cell.

By the static random access memory, the one terminal of the capacitor may be sustained in a floating state in response to a writing command, the clamping unit may connect the first and second bit lines with the capacitor to each other for certain time, to reduce the voltage level of the pre-charged first and second bit lines by a certain voltage level, in the state that the voltage level of the first and second bit lines varies depending on data stored in the bit cell, the writing driving unit complementarily may apply low-level input data and high-level input data to the first and second bit lines, the other terminal of the capacitor connected to the writing driving unit may be sustained in the floating state, the one terminal of the capacitor may be grounded to generate a negative voltage in the other terminal of the capacitor, and the capacitor may be connected to the first or second bit line, to which the low-level input data are applied, to reduce the voltage level of the corresponding bit line.

The present disclosure also concerns a method for driving a static random access memory. The method may include: pre-charging first and second bit lines connected to a bit cell; sustaining a capacitor included in a unit memory cell unit in a floating state; connecting the first and second bit lines with the capacitor for certain time through a clamping unit connected between the first and second bit lines and the capacitor, to reduce a voltage level of the pre-charged first and second bit lines by a certain voltage level, for providing charge-recycling effect; and sensing data of the bit cell based on variation of the voltage level of the first and second bit lines depending on the data stored in the bit cell.

In the method, the step of sustaining of the capacitor in the floating state may include grounding one terminal of the capacitor, and then, floating the same.

The method may further include, after the step of sensing of the data of the bit cell, complementarily applying low-level input data and high-level input data to the first and second bit lines through a writing driving unit; sustaining the other terminal of the capacitor connected to the writing driving unit in the floating state; grounding the one terminal of the capacitor to generate a negative voltage in the other terminal of the capacitor; and connecting the capacitor to the first or second bit line, to which the low-level input data are applied, to reduce the voltage level of the corresponding bit line.

Effect of the Invention

In accordance with one of the above-described technical means of the present disclosure, it is possible to improve the operation margin of the reading and writing operations and reduce a power consumed in an assist circuit, by integratively implementing the reading and writing operations through a charge recycling method in the assist circuit technique of the SRAM.

In addition, it is possible to greatly reduce power consumption by generating a negative voltage used in the SRAM assist circuit technique by using a capacitive coupling effect that is supplied with a charge from a bit line (i.e., charge-recycling effect), rather than a conventional capacitor driving method. As a result, the operation margin of the reading and writing operations can be improved without consuming a significant power, and the operations can be implemented even at a low supply voltage without causing any error.

In addition, since the reading and writing operations can be implemented in one circuit, separate power consumption does not occur.

In addition, the SRAM may be used in a multi-port SRAM as well as a single-port SRAM without affecting other bit cells, which are simultaneously connected.

BRIEF DESCRIPTION OF THE DRAWINGS

FIG. 8 is a flow chart for a reading operation in the static random access memory cell.

DETAILED DESCRIPTION

Figure 1:
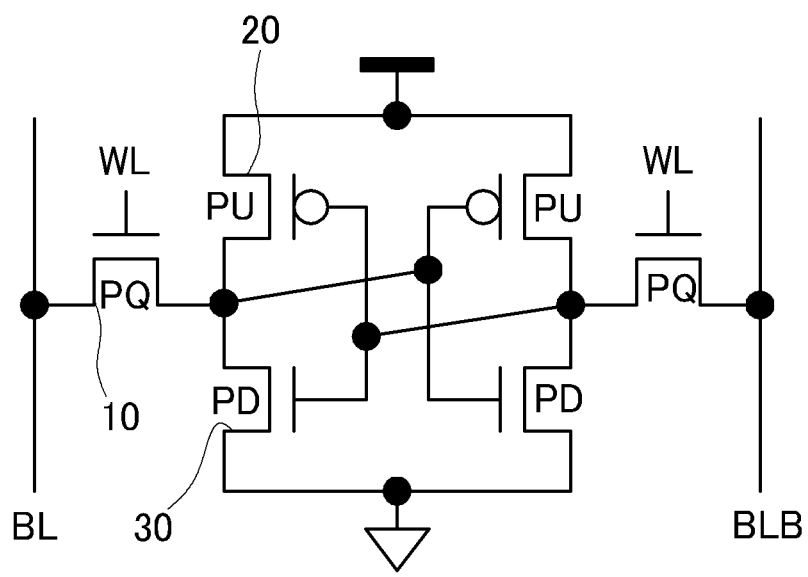
FIG. 1 is an example for a 6T SRAM cell in accordance with a conventional technology.
Figure 2:
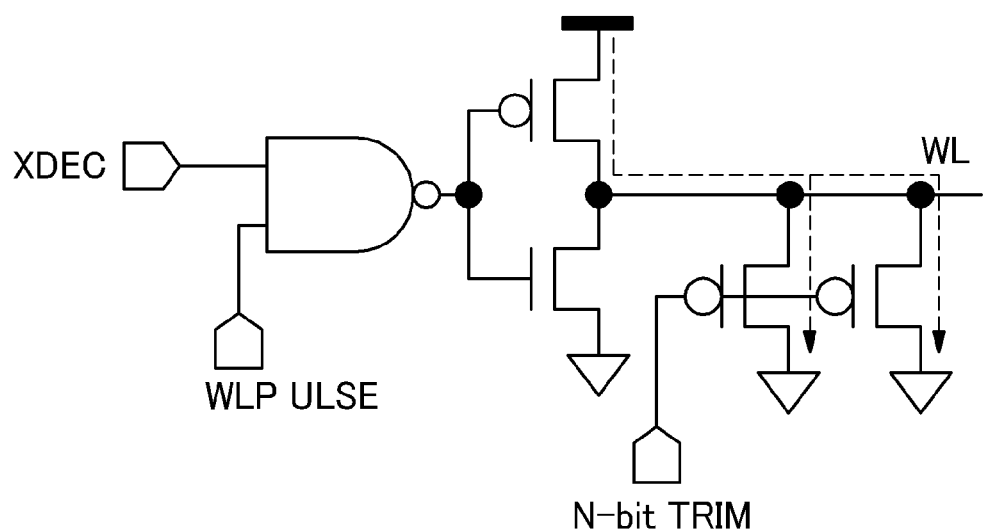
FIG. 2 illustrates an assist circuit of a SRAM cell in accordance with a conventional technology.
Figure 3:
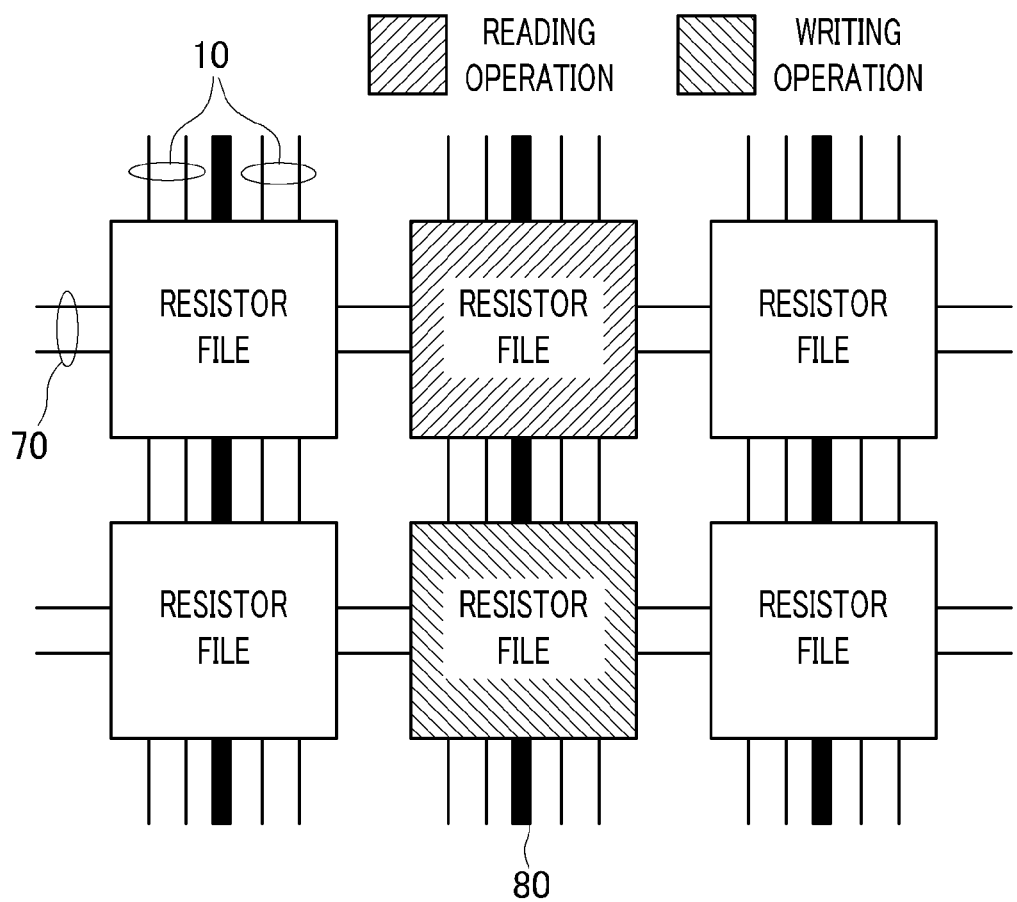
FIG. 3 illustrates another assist circuit of a SRAM cell in accordance with a conventional technology.

Hereinafter, example embodiments will be described in detail with reference to the accompanying drawings so that inventive concept may be readily implemented by those skilled in the art. However, it is to be noted that the present disclosure is not limited to the example embodiments but can be realized in various other ways. In the drawings, certain parts not directly relevant to the description are omitted to enhance the clarity of the drawings, and like reference numerals denote like parts throughout the whole document.

Throughout the whole document, the terms "connected to" or "coupled to" are used to designate a connection or coupling of one element to another element and include both a case where an element is "directly connected or coupled to" another element and a case where an element is "electronically connected or coupled to" another element via still another element. In addition, the term "comprises or includes" and/or "comprising or including" used in the document means that one or more other components, steps, operation and/or existence or addition of elements are not excluded in addition to the described components, steps, operation and/or elements unless context dictates otherwise. Throughout the whole document, the term "step of" does not mean "step for."

Figure 4:
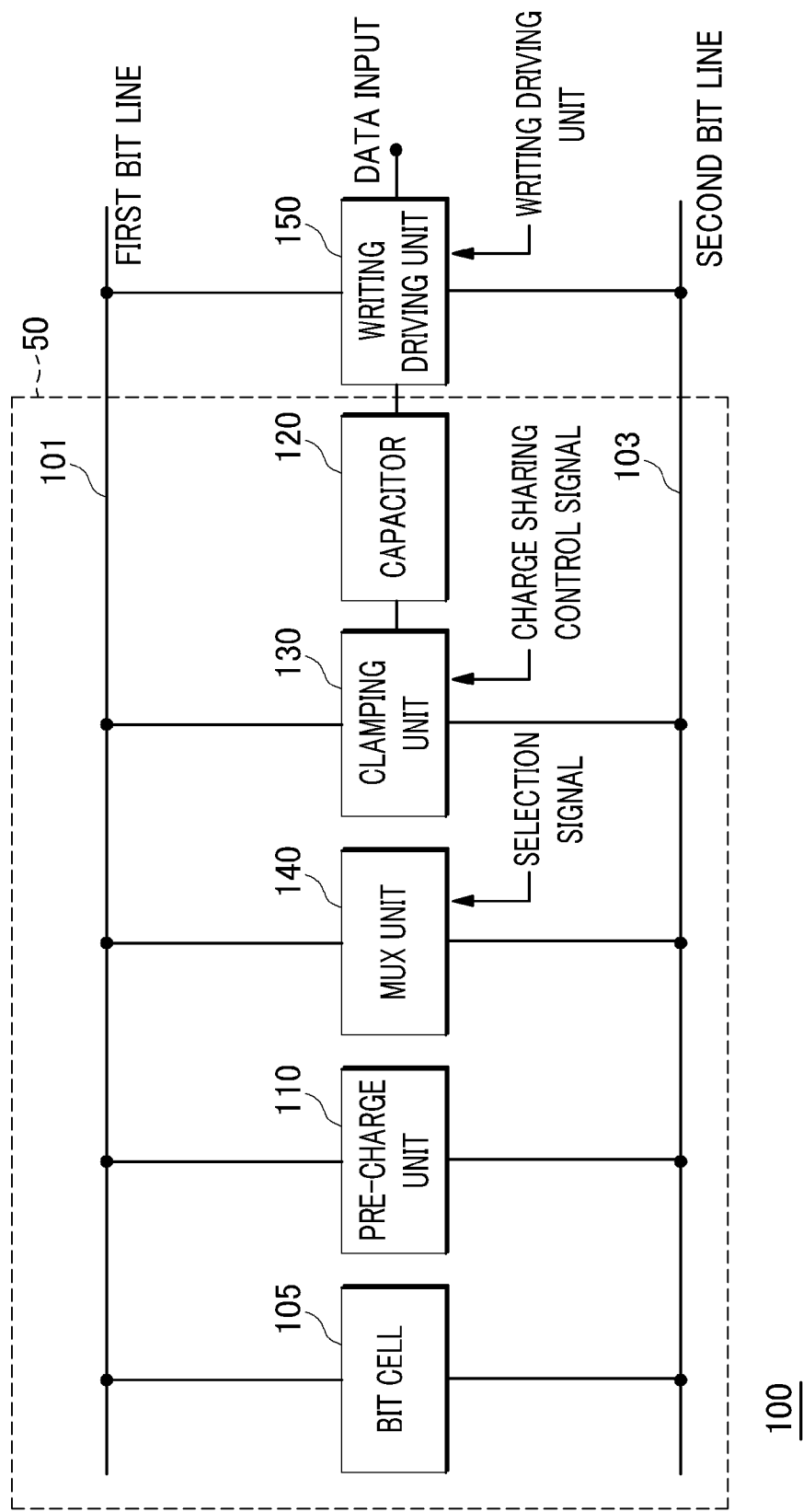
FIG. 4 illustrates a static random access memory cell.

FIG. 4 illustrates a static random access memory sell 100. The static random access memory cell 100 includes a pre-charge unit 110, a capacitor 120, a clamping unit 130 and a mux unit 140. The pre-charge unit 110 supplies a pre-charge voltage to a first bit line 101 and a second bit line 102, which are connected to a bit cell 105. In this case, the pre-charge unit 110 may supply a pre-charge voltage with a supply voltage (VDD) level to the first and second bit lines 101, 103 in response to a pre-charge signal.

One or the other terminal of the capacitor 120 is selectively connected to a ground terminal. In this case, one or the other terminal of the capacitor 120 is selectively connected to a ground terminal, and the capacitor 120 may be pre-charged with a ground (GND) level prior to implementation of a writing or reading operation.

The clamping unit 130 selectively connects the bit lines 101, 103 with the capacitor 120 so as to adjust the voltage levels of the bit lines 101, 103. In this case, the clamping unit 130 connects the first and second bit lines 101, 103 with the capacitor 120 in response to a charge sharing control signal, so as to induce charge sharing between the first and second bit lines 101, 103 and the capacitor 120. Once the clamping unit 130 connects the bit lines 101, 103 with the capacitor 120, the bit lines 101, 103 and the capacitor 120 share a charge. As a result, the supply voltage level pre-charged to the bit lines 101, 103 is lowered, and the capacitor 120 is charged with the charge supplied from the bit lines 101, 103. Accordingly, by lowering the voltage level of the bit lines 101, 103, the margin of the reading operation can be improved. In this case, the charge charged in the capacitor 120 is used to generate a negative voltage, and the negative voltage is supplied to the bit lines 101, 103 upon the writing operation to increase the strength of the pass-gate NMOS of the bit cell 105, and thereby, improving the margin of the writing operation.

The mux unit 140 receives a selection signal to activate a multiple number of unit memory cells 50, which are connected to one another in parallel, and activates the bit lines 101, 103 of the unit memory cells 50 in response to the reception of the selection signal. In this case, the unit memory cells 50 include the bit cell 105, the pre-charge unit 110, the capacitor 120, the clamping unit 130 and the mux unit 140. The static random access memory cell 100 in accordance with an example embodiment may include one or more unit memory cells 50.

Meanwhile, the static random access memory cell 100 may further include a writing driving unit 150. The writing driving unit 150 may apply complementary-level input data to the first bit line 101 and the second bit line 102 in response to a writing driving signal. That is, where high-level input data are applied to the first bit line 101 based on a writing driving signal, low-level input data may be applied to the second bit line 103.

In some scenarios, the static random access memory cell 100 may include one or more writing driving units 150. One writing driving unit 50 may be connected to the multiple unit memory cells 50.

Hereinafter, the process, in which the static random access memory cell's 100 writing and reading operations are based on the above-described components, is described.

First, in order to implement the reading operation, the static random access memory cell 100 sustains one terminal of the capacitor 120 in the floating state in response to a reading command. The clamping unit 130 connects the bit lines 101, 103 with the capacitor 120 for certain time, so as to reduce the voltage level of the pre-charged bit lines 101, 103 by a certain voltage level. In this case, a charge as much as the voltage level reduced in the pre-charged bit lines 101, 103 is charged in the capacitor 120. When the voltage level of the bit lines 101, 103 is reduced, the voltage level of the first and second bit lines 101, 103 changes depending on data stored in the bit cell 105, and on this basis, the data of the bit cell 105 are sensed and read.

Meanwhile, in order to implement the writing operation, the static random access memory cell 100 sustains one terminal of the capacitor 120 in the floating state in response to a writing command. The clamping unit 130 connects the first and second bit lines 101, 103 with the capacitor 120 for certain time, so as to reduce the voltage level of the pre-charged bit lines 101, 103 by a certain voltage level. When the voltage level of the bit lines 101, 103 is reduced, the voltage level of the first and second bit lines 101, 103 changes depending on the data stored in the bit cell 105, and the data of the bit cell 105 is sensed based on the change. That is, the operation of reading the data stored in the bit cell 105 is also identically implemented upon the implementation of the writing operation, and this contributes to avoiding that data of other addresses are changed by an activated word line.

Once the data reading is completed, the writing driving unit 150 complementarily applies input data to the first and second bit lines 101, 103. In this case, to write '1,' low-level input data are applied to the first bit line 101, and high-level input data are applied to the second bit line 103. To the contrary, to write '0,' high-level input data are applied to the first bit line 101, and low-level input data are applied to the second bit line 103. The other terminal of the capacitor 120 connected to the writing driving unit 150 is sustained in the floating state, and then, the one terminal of the capacitor 120 is grounded so as to generate a negative voltage in the other terminal of the capacitor 120. After that, the capacitor 120 is connected to either the first bit line 101 or the second bit line 103, to which the low-level input data are applied, to supply a negative voltage, and thereby, reducing the voltage level of the corresponding bit line 101 or 103. Accordingly, as the negative voltage generated in the capacitor 120 is supplied to the bit lines 101, 103 upon the writing operation, the strength of the pass-gate NMOS increases, and thereby, improving the margin of the writing operation.

Figure 5:
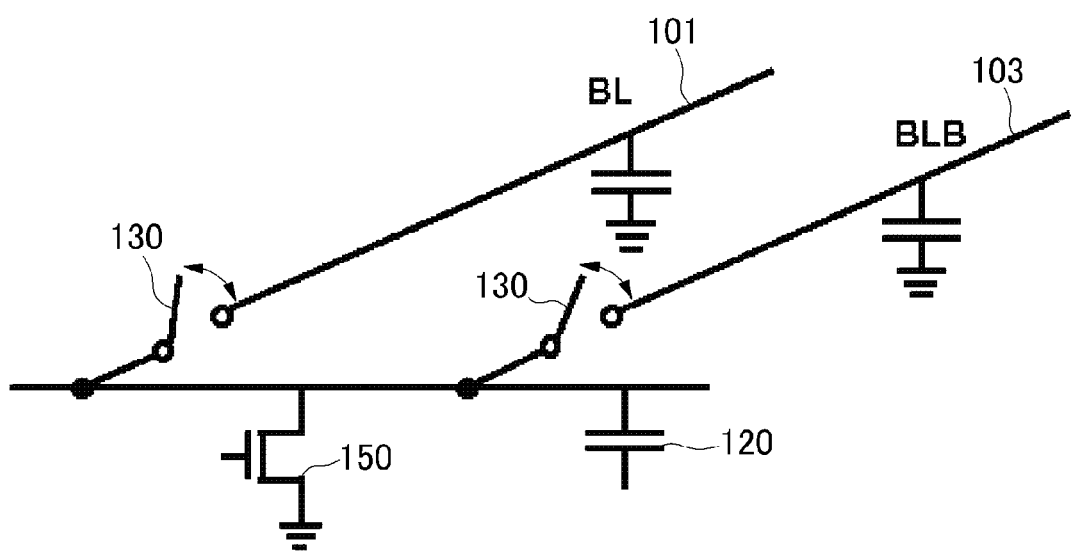
FIG. 5 describes an operation principle of the static random access memory cell.

FIG. 5 describes an operation principle of the static random access memory cell. The first and second bit lines 101, 103 illustrated in FIG. 5 are charged with the pre-charge voltage supplied from the pre-charge unit 110. The capacitor 120 is pre-charged with a ground voltage. In this case, the clamping unit 130 selectively connects the bit lines 101, 130 with the capacitor 120 so as to adjust the voltage level of the bit lines 101, 103. In this case, the clamping unit 130 connects the bit lines 101, 103 with the capacitor 120 for certain time, so as to reduce the voltage level of the pre-charged bit lines 101, 103 by a certain voltage level. In this case, a charge corresponding to the voltage reduced in the pre-charged bit lines 101, 103 moves to and charges the capacitor 120.

When the clamping unit 130 connects the bit lines 101, 103 with the capacitor 120 for certain time, and then, blocks the connection, the capacitor 120 sustains the floating state in the state that it is charged with the certain charge. In this case, once the one terminal of the capacitor 120 is grounded, a negative voltage is generated in the other terminal of the capacitor 120. The other terminal of the capacitor 120, in which the negative voltage has been generated, and the first bit line 101 or 103, to which the low-level input data have been applied, are connected to each other so as to reduce the voltage level of the corresponding bit line. Based on the reduced voltage level, the writing driving unit 150 implements the writing operation.

Figure 6:
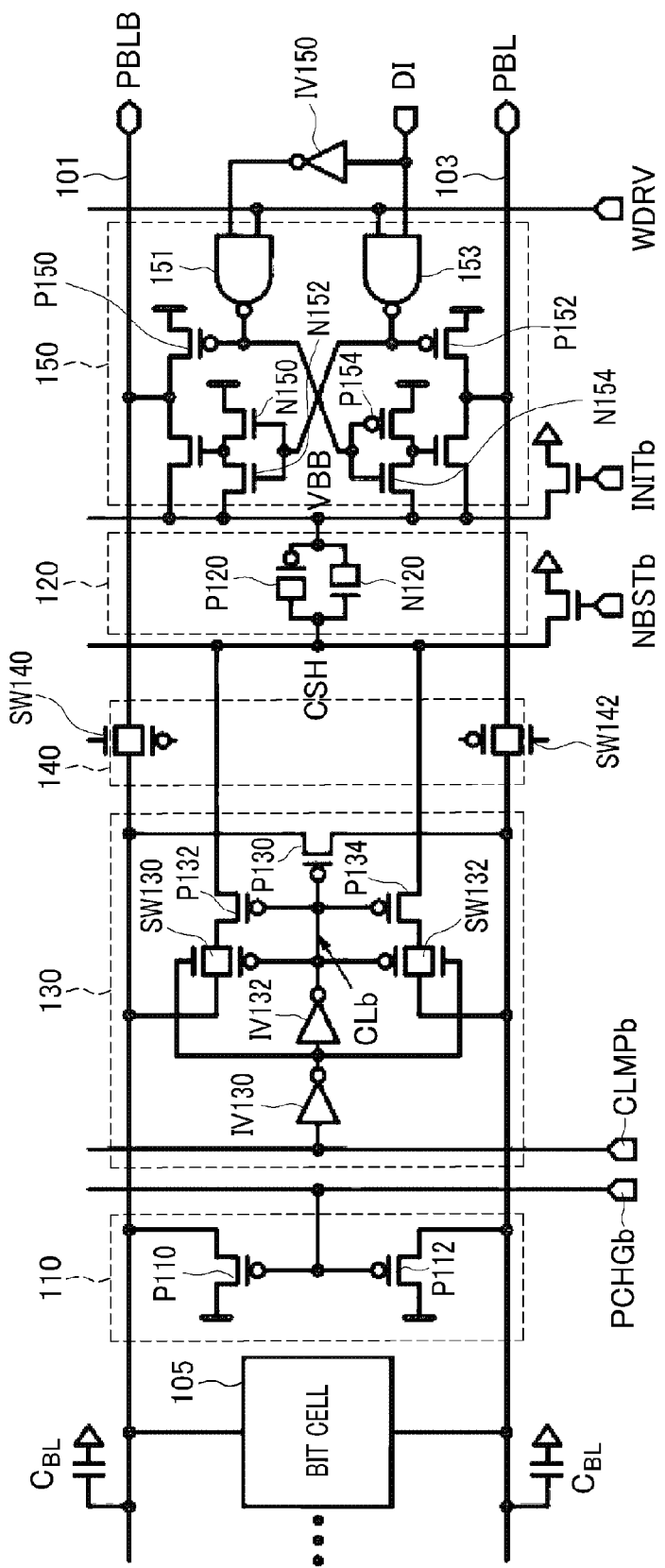
FIG. 6 is a circuit diagram of the static random access memory cell.
Figure 7A:
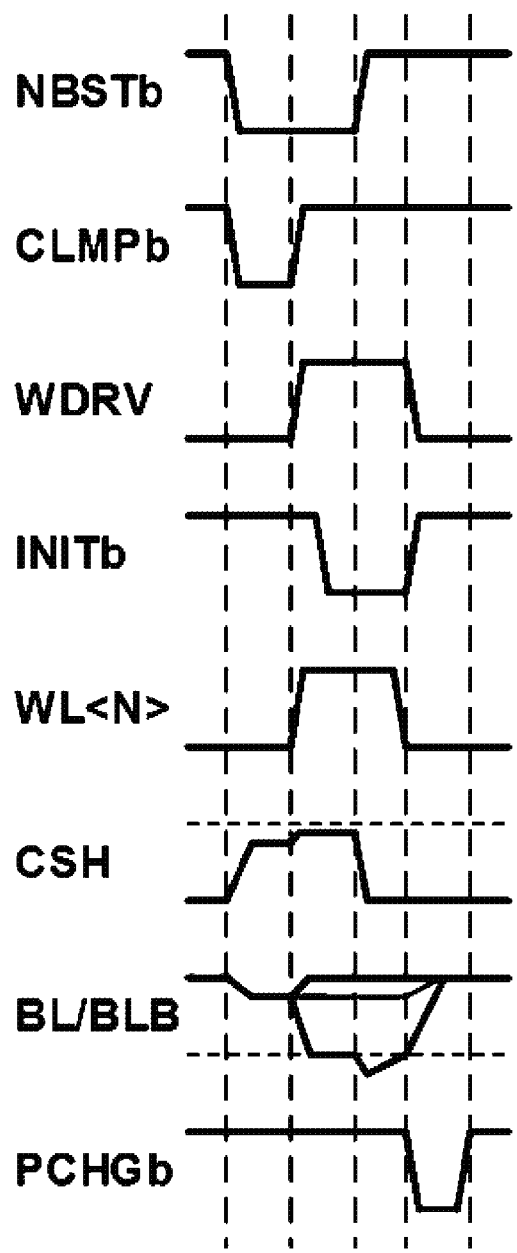
FIG. 7A is a graph showing voltage level variation upon implementation of a writing operation in the circuit diagram illustrated in FIG. 6.
Figure 7B:
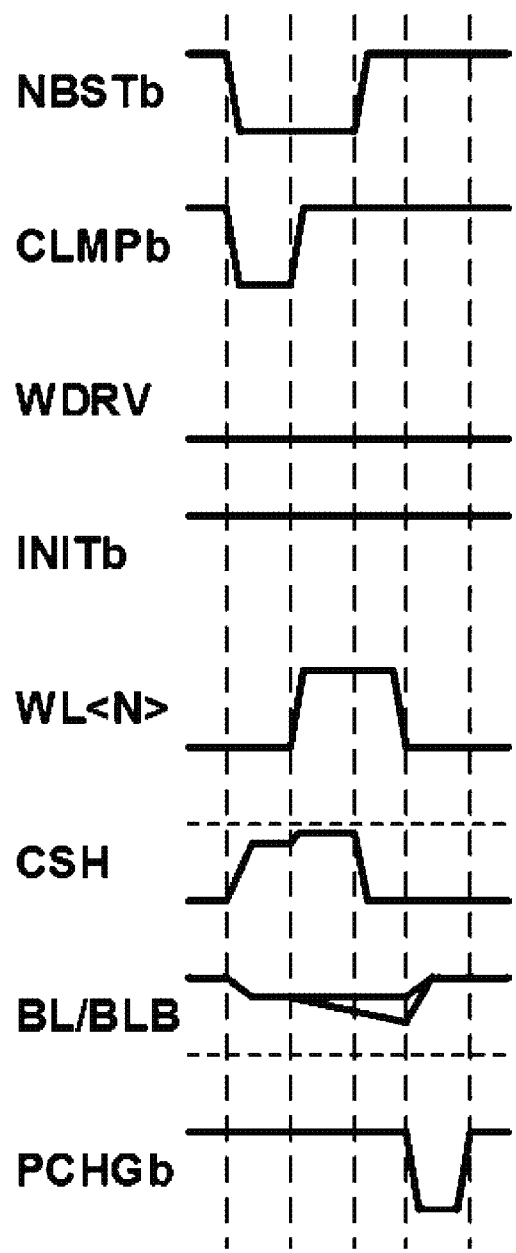
FIG. 7B is a graph showing voltage level variation upon implementation of a reading operation in the circuit diagram illustrated in FIG. 6.

FIG. 6 is a circuit diagram of the static random access memory cell 100. FIG. 7A is a graph showing voltage level variation upon implementation of the writing operation in the circuit diagram illustrated in FIG. 6. FIG. 7B is a graph showing voltage level variation upon implementation of the reading operation in the circuit diagram illustrated in FIG. 6.

First, an example for the circuit of the static random access memory cell 100 is described with reference to FIG. 6.

As illustrated in FIG. 6, the static random access memory cell 100 includes the pre-charge unit 110, which includes a first PMOS P110 and a second PMOS P112, the capacitor 120, which includes a NMOS capacitor N120 and a PMOS capacitor P120, the clamping unit 130, which includes a first inverter IV130, a second inverter IV132, a first transmission gate SW130, a second transmission gate SW132, PMOS P130, a third PMOS P132 and a fourth PMOS P134, the mux unit 140, which includes a third transmission gate SW140 and a fourth transmission gate SW142, and the writing driving unit 150, which includes first and second NAND gates 151, 153.

Specifically, the first PMOS P110 and the second PMOS P112 of the pre-charge unit 110 provide, as a pre-charge signal, a supply voltage (VDD) supplied through a PCHGb input terminal to the first bit line 101 (PBLB) and the second bit line 103 (PBL). The first PMOS P110 and the second PMOS P112 are connected between the first bit line 101 (PBLB) and the ground terminal and between the second bit line 103 (PBL) and the ground terminal, respectively, and gate terminals of the first PMOS P110 and the second PMOS P112 are connected to each other.

A source terminal and a drain terminal are connected to the NMOS capacitor N120 and the PMOS capacitor P120 of the capacitor 120, respectively. In this case, the gate terminal of the NMOS capacitor N120, the source and drain terminals of the PMOS capacitor P120, and the one terminal (CSH) of the capacitor 120 are connected to one another. In addition, the gate terminal of the PMOS capacitor P120, the source and drain terminals of the NMOS capacitor N120, and the other terminal (VBB) of the capacitor 120 are connected to one another. The one terminal (CSH) of the capacitor 120 is connected to a NBSTb terminal, which receives input of a signal to connect the capacitor 120 with the ground terminal and block the access in response to a writing command, and the clamping unit 130, which is described later. In addition, the other terminal (VBB) of the capacitor 120 is connected to an INITb terminal, and the other terminal (VBB) pre-charged with the ground voltage becomes in the floating state depending on an input voltage to be applied from the INITb terminal.

The first inverter IV130 and the second inverter IV132 of the clamping unit 130 are connected to each other in series. One terminal of each of the first transmission gate SW130 and the second transmission gate SW132 is connected to a ground terminal between the first inverter IV130 and the second inverter IV132, and the other terminal thereof is connected to the second inverter IV132. In addition, in the PMOS P130 of the clamping unit 130, a first terminal is connected to the second inverter IV132, the first transmission gate SW130 and the second transmission gate SW132, a second terminal thereof is connected to the first bit line 101 (PBLB), and a third terminal is connected to the second bit line 103 (PBL). In this case, each of the first transmission gate SW130 and the second transmission gate SW132 may operate as a switch. In addition, in each of the third PMOS P132 and the fourth PMOS P134 of the clamping unit 130, one terminal is connected to the first transmission gate SW130 and the second transmission gate SW132, and the other terminal is connected to the one terminal (CSH) of the capacitor 120.

The third transmission gate SW140 of the mux unit 140 is connected to the first bit line 101 (PBLB), and the fourth transmission gate SW142 is connected to the second bit line 103 (PBL).

An input data signal is applied to each of the first and second NAND gates 151, 153 of the writing driving unit 150. In this case, one of input terminals of the first NAND gate 151 receives an input data signal inverted through the inverter IV150. An output terminal of the first NAND gate 151 is connected to a common terminal, in which a gate terminal of the fifth PMOS P150, a gate terminal of the third NMOS N154 and a gate terminal of the seventh PMOS P154 are connected to one another. For the fifth PMOS P150, one terminal is grounded, and the other terminal is connected to the first bit line 101 (PBLB). In addition, the output terminal of the second NAND gate 153 is connected to a common terminal, in which a gate terminal of the sixth PMOS P152, a gate terminal of the first NMOS N150 and a gate terminal of the second NMOS N152 are connected to one another. For the sixth PMOS P152, one terminal is grounded, and the other terminal is connected to the second bit line 103 (PBL).

Hereinafter, a principle of the writing operation is described with reference to FIG. 6 and FIG. 7A.

The first bit line 101 (PBLB) and the second bit line 103 (PBL) are pre-charged with the supply voltage level (VDD) by the pre-charge unit 110, and the capacitor 120 is grounded to the ground terminal to be pre-charged with the ground voltage level.

In this state, a signal for controlling the grounding of the capacitor 120 and blocking the grounding is input into the NBSTb terminal in response to a writing command. In this case, as illustrated in FIG. 7A, a low-level voltage is input into the NBSTb terminal, so that the connection between the capacitor 120 and the ground terminal is blocked. As a result, the one terminal (CSH) of the capacitor 120 is sustained in the floating state.

A charge sharing control signal for controlling the operation of the clamping unit 130 so as to control the connection between the bit lines 101, 103 and the capacitor 120 and blocking the connection is input into the CLMPb terminal. In this case, as illustrated in FIG. 7A, a low-level voltage is input into the CLMPb terminal so that the first and second bit lines 101, 103 and the capacitor 120 are connected to each other by the operation of the clamping unit 130. As a result, the voltage level of the first bit line 101 (PBLB) and the second bit line 103 (PBL) is reduced by a certain voltage level. The reading operation is implemented by lowering the voltage level of the bit lines 101, 103, and as a result, the margin of the reading operation can be improved.

Next, as illustrated in FIG. 7A, a high-level voltage is input into the CLMPb terminal so that the connection between the bit lines 101, 103 and the capacitor 120 is blocked. Accordingly, the voltage level of the first and second bit lines 101, 103 varies by the data stored in the bit cell 105, and the variation is sensed so as to read the data of the bit cell 105.

After the implementation of the reading operation, a high-level voltage is input as a writing driving signal of the writing driving unit 150 into the WDRV terminal as illustrated in FIG. 7A. Accordingly, data are applied to each of the first bit line 101 (PBLB) and the second bit line 103 (PBL) through the writing driving unit 150.

In this case, in order to improve the margin of the writing operation, a high-level voltage is input into the NBSTb terminal to ground the one terminal (CSH) of the capacitor 120, in the state that the other terminal (VBB) of the capacitor 120 connected to the writing driving unit 150 is sustained in the floating state. As a result, a negative voltage is applied to the other terminal (VBB) of the capacitor 120.

Once the implementation of the above-described operation is completed, a low-level voltage is input as a writing driving signal into the WDRV terminal, and a low-level voltage signal is input into the PCHGb terminal. In this case, the pre-charge unit 110 pre-charges the first and second bit lines 101, 103 with the supply voltage (VDD) level once again so as to make the bit lines wait for implementing a following operation.

Next, a principle of the reading operation is described with reference to FIG. 6 and FIG. 7B.

Additionally, since the writing driving unit 150 does not operate upon the reading operation, the voltage levels of the WDRV terminal, to which a writing driving signal is applied, and the INITb terminal, to which a signal for floating the other terminal (VBB) of the capacitor 120 is applied, do not change.

The first bit line 101 (PBLB) and the second bit line 103 (PBL) are pre-charged with the supply voltage level (VDD) by the pre-charge unit 110, and the capacitor 120 is connected to the ground terminal to be pre-charged with the ground voltage level.

In this state, a low-level voltage is input into the NBSTb terminal as shown in FIG. 7B, in response to a reading command. Accordingly, the connection between the capacitor 120 and the ground terminal is blocked so that the one terminal (CSH) of the capacitor 120 is sustained in the floating state.

As shown in FIG. 7B, a low-level voltage is input into the CLMPb terminal so that the first and second bit lines 101, 103 and the capacitor 120 are connected to each other by the operation of the clamping unit 130. Accordingly, the voltage level of the first and second bit lines 101, 103 is reduced by a certain voltage level. As a result, the reading operation, of which margin is improved, may be implemented by reducing the voltage level of the first and second bit lines 101, 103.

Meanwhile, the circuit of the static random access memory cell 100 is limited to the components of the circuit that has been described. The positions of the components may change, and the internal circuit form of each of the components may also be realized in various forms.

Hereinafter, a method for driving the static random access memory cell is described with reference to FIG. 8 and FIG. 9.

FIG. 8 is a flow chart of the reading operation in the static random access memory cell 100.

First, the first and second bit lines connected to the bit cell are pre-charged (S805).

In this case, the first and second bit lines may be pre-charged with the supply voltage level (VDD). One or the other terminal of the capacitor included in a unit memory cell unit is selectively connected to the ground terminal, and may be pre-charged with the ground (GND) level prior to implementation of the reading (or writing) operation.

Next, the capacitor is sustained in the floating state in response to a reading (or writing) command (S810).

In this case, the one terminal of the capacitor may be floated by grounding the one terminal of the capacitor.

Next, the first and second bit lines and the capacitor are connected to each other for certain time through the clamping unit connected between the first and second bit lines and the capacitor, so as to reduce the voltage level of the pre-charged bit lines by a certain voltage level (S815).

In this case, the clamping unit connects the first and second bit lines and the capacitor to each other based on a charge sharing control signal to induce charge sharing. Through the charge sharing, the pre-charged voltage level of the bit lines is lowered, and the capacitor is charged with the charge supplied from the bit lines. Accordingly, the margin of the reading operation can be improved by reducing the voltage level of the bit lines.

Next, data are read by sensing the data of the bit cell based on variation of the voltage level of the first and second bit lines depending on the data stored in the bit cell (S820).

Figure 9:
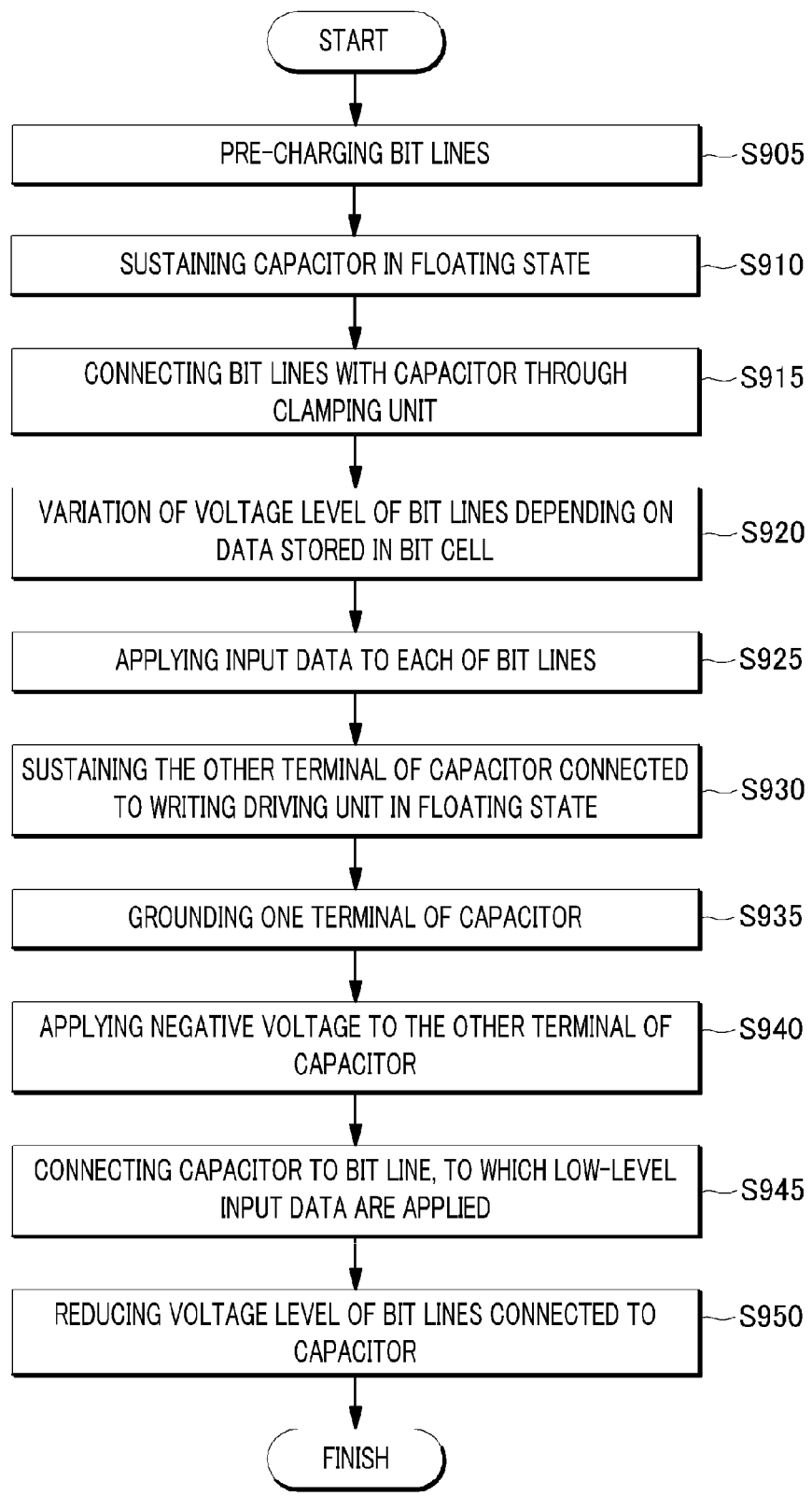
FIG. 9 is a flow chart for a writing operation in the static random access memory cell.

FIG. 9 is a flow chart of the writing operation in the static random access memory cell 100.

Additionally, the method for driving the static random access memory cell may implement the step identical to the reading operation described above by using FIG. 8, prior to implementation of the writing operation. Accordingly, upon implementation of the writing operation, the steps (S905 to S920) illustrated in FIG. 9 identically implement operations, which correspond to the steps (S805 to S820) described above by using FIG. 8, so as to change the voltage level of the first and second bit lines.

After the implementation of the operations until the step S920, the writing driving unit applies input data into each of the first and second bit lines.

Specifically, as described above with reference to FIG. 4, to write '1' as input data, low-level input data are applied to the first bit line, and high-level input data are applied to the second bit line. To the contrary, to write '0' as input data, high-level input data are applied to the first bit line, and low-level input data are applied to the second bit line.

Next, the other terminal of the capacitor connected to the writing driving unit is sustained in the floating state (S930), and the one terminal of the capacitor is grounded (S935).

Accordingly, once a negative voltage is applied to the other terminal of the capacitor (S940), the capacitor is connected to the first or second bit line, to which the low-level input data have been applied (S945), so as to reduce the voltage level of the corresponding bit line (S950).

As the negative voltage generated in the capacitor is supplied to the bit line upon the writing operation, the strength of the pass-gate NMOS of the bit cell increases, and thereby, improving the margin of the writing operation.

The above description of the exemplary apparatus and methods is provided for the purpose of illustration, and it would be understood by those skilled in the art that various changes and modifications may be made without changing technical conception and essential features of the exemplary apparatus and methods. Thus, it is clear that the above-described exemplary apparatus and methods are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the example exemplary apparatus and methods. It shall be understood that all modifications and embodiments conceived from the meaning and scope of the claims and their equivalents are included in the scope of the inventive concept.

We claim:

1. A static random access memory, comprising:
   a pre-charge unit that supplies a pre-charge voltage to first and second bit lines connected to a bit cell;
   a capacitor, of which one or the other terminal is selectively connected to a ground terminal;
   a clamping unit that selectively connects the first and second bit lines with the capacitor to adjust a voltage level of the bit lines;
   a mux unit that is included in a unit memory cell including the bit cell, the pre-charge unit, the capacitor and the clamping unit, and activates the bit lines of the unit memory cell in response to reception of a selection signal; and
   a writing driving unit that complementarily applies low-level input data and high-level input data to the first and second bit lines, wherein a level of input data of the first bit line is different from that of the second bit line, at the same time;
   wherein the clamping unit connects the first and second bit lines with the capacitor in response to a charge sharing control signal, to induce charge sharing between the first and second bit lines and the capacitor, for providing charge-recycling effect.

2. The static random access memory of claim 1, wherein
   the one terminal of the capacitor is sustained in a floating state in response to a reading command,
   the clamping unit connects the first and second bit lines with the capacitor to each other for certain time to reduce the voltage level of the pre-charged bit lines by a certain voltage level, and
   data of the bit cell are read based on variation of the voltage level of the first and second bit lines depending on the data stored in the bit cell.

3. The static random access memory of claim 1, wherein
   the one terminal of the capacitor is sustained in a floating state in response to a writing command,
   the clamping unit connects the first and second bit lines with the capacitor to each other for certain time, to reduce the voltage level of the pre-charged first and second bit lines by a certain voltage level,
   in the state that the voltage level of the first and second bit lines varies depending on data stored in the bit cell, the writing driving unit complementarily applies low-level input data and high-level input data to the first and second bit lines,
   the other terminal of the capacitor connected to the writing driving unit is sustained in the floating state,
   the one terminal of the capacitor is grounded to generate a negative voltage in the other terminal of the capacitor, and
   the capacitor is connected to the first or second bit line, to which the low-level input data are applied, to reduce the voltage level of the corresponding bit line.

4. A method for driving a static random access memory, comprising:
   pre-charging first and second bit lines connected to a bit cell;
   sustaining a capacitor included in a unit memory cell unit in a floating state;
   connecting selectively the first and second bit lines with the capacitor for certain time through a clamping unit connected between the first and second bit lines and the capacitor, to reduce a voltage level of the pre-charged first and second bit lines by a certain voltage level, for providing charge-recycling effect;
   sensing data of the bit cell based on variation of the voltage level of the first and second bit lines depending on the data stored in the bit cell; and
   complementarily applying low-level input data and high-level input data to the first and second bit lines through a writing driving unit;
   wherein a level of input data of the first bit line is different from that of the second bit line, at the same time.

5. The method for driving a static random access memory of claim 4, wherein the step of sustaining of the capacitor in the floating state comprises grounding one terminal of the capacitor, and then, floating the same.

6. The method for driving a static random access memory of claim 4, further comprising:
   after the step of complementarily applying:
      sustaining the other terminal of the capacitor connected to the writing driving unit in the floating state;
      grounding the one terminal of the capacitor to generate a negative voltage in the other terminal of the capacitor; and
      connecting the capacitor to the first or second bit line, to which the low-level input data are applied, to reduce the voltage level of the corresponding bit line.

* * * * *